United States Patent [19]

Healey, III

[11] 3,878,481

[45] Apr. 15, 1975

[54] LOW NOISE VHF OSCILLATOR WITH CIRCUIT MATCHING TRANSISTORS

[75] Inventor: Daniel J. Healey, III, Baltimore, Md.

[73] Assignee: Westinghouse Electric Corporation, Pittsburgh, Pa.

[22] Filed: Nov. 2, 1973

[21] Appl. No.: 412,515

[52] U.S. Cl. .......... 331/105; 331/116 R; 331/117 R; 331/159

[51] Int. Cl. .......... H03b 1/04; H03b 5/36

[58] Field of Search .......... 331/116 R, 117 R, 117 D, 331/105, 158, 159, 167, 168

[56] References Cited

UNITED STATES PATENTS

| | | | |
|---|---|---|---|
| 2,900,608 | 8/1959 | Carroll et al. | 331/116 R X |
| 3,299,371 | 1/1967 | Ryan | 331/117 X |
| 3,747,012 | 7/1973 | Buck | 331/117 R X |

*Primary Examiner*—Siegfried H. Grimm
*Attorney, Agent, or Firm*—D. Schron

[57] ABSTRACT

A VHF oscillator circuit is disclosed providing a higher stable gain than achieved with prior art designs. In particular, there is disclosed first and second transistors, a first resonant circuit coupled to each of the collectors of the first and second transistors, and means typically taking the form of a transformer for coupling energy from the first resonant circuit in a manner that signals of substantially equal amplitude but opposite phase are applied respectively to the bases of the first and second transistors. Further, bypass means typically taking the form of a capacitor is connected to the emitter of the second transistor. In addition, an antiresonant circuit comprising a crystal unit is connected to the emitter of the first transistor and a suitable diode limiting circuit is provided to prevent saturation of the first and second transistors.

12 Claims, 10 Drawing Figures

(MODIFIED PIERCE)

(MODIFIED PIERCE)

(MODIFIED PIERCE)

(MODIFIED BUTLER-BRIDGED TEE)

$$Z = gmX_1X_2 + (X_1 + X_2)$$

$$X_1 = \frac{1}{\frac{1}{j2\pi f L_{10}} + j2\pi f_0 C_{10}}$$

$$X_2 = \frac{1}{j2\pi f_0 C_{11}}$$

LOW NOISE VHF OSCILLATOR WITH CIRCUIT MATCHING TRANSISTORS

CROSS REFERENCE TO RELATED APPLICATIONS

Reference is made to commonly assigned, co-pending U.S. Patent Application Ser. No. 383,627 (Westinghouse Case No. 43,636), filed July 30, 1973, entitled, "Improved Microwave Signal Source and Method" by Daniel J. Healey III; and to commonly assigned, co-pending U.S. Patent application Ser. No. 375,524 (Westinghouse Case No. 44,358), filed July 2, 1973 entitled, "Low Noise VHF Crystal Controlled Harmonic Oscillator", by M. M. Driscoll and D. J. Healey, III.

BACKGROUND OF THE INVENTION

1. Field of the Invention

This invention relates to a very high frequency (VHF) crystal controlled harmonic oscillator and, more particularly, to such an oscillator having very low noise properties.

2. State of the Prior Art

The achievement of high performance from a coherent pulse Doppler radar set (coherent MTI) is dependent on the radar sensitivity in practice being limited by receiver noise that exists in the absence of any received signals. Such systems are essentially single sideband transmitting and receiving apparatus, and separation of received signals occurring simultaneously in time is achieved by separation of the frequency of the signals. The ability to separate a small signal from a large signal by such means is dependent on the FM and PM noise (short-term frequency stability) exhibited by the radar transmitter and the beating signal generators employed to down-convert the received signals to frequencies at which the requisite frequency selective filtering becomes practical.

An important component of such radar sets is the carrier frequency generator employed for the transmitter exciter and the beating signal generator for providing the first frequency changing operation in the receiver. In systems having well designed amplifiers and auxiliary circuits for the transmitter, and a well designed receiver that exhibits adequate cross-modulation and intermodulation characteristics, the performance characteristics of these frequency generators will determine the radar detection performance in the presence of large natural signal interference resulting from ground sea and cloud echoes.

In such radar systems as well as other communication systems, it is extremely desirable to provide a source of extremely low noise microwave frequency signal. A significant measure of the noise content of a microwave signal is the indication of the power spectrum as provided by the parameter $L(f)$, defined as the ratio of the power in one phase noise sideband referred to the input carrier frequency, on a per Hertz of bandwidth spectral density basis, to the total signal power at an offset Fourier frequency $f$ from the signals average or nominal frequency $f_o$. The parameter $L(f)$ typically is expressed in units of dB/Hz. Such a signal may be referred to as having low noise power levels at Fourier frequencies at some minimal Fourier frequency, where Fourier frequency is defined as the frequency offset from the nominal or average frequency $f_o$ of the signal.

Available microwave signal sources such as crystal controlled oscillators may provide an output signal which has a sufficiently narrow power spectral density in that the signal power level is minimal at low Fourier frequencies about the desired nominal or center frequency $f_o$ of the crystal controlled oscillator. However, at high Fourier frequencies about the center frequency $f_o$ of the crystal controlled oscillator, the noise power level may be unacceptable.

On the other hand, a cavity resonator microwave transistor oscillator may provide a microwave signal having acceptable noise characteristics at the higher Fourier frequencies about the center frequency of the oscillator but may be unacceptable at the lower Fourier frequencies.

With either of the above types of microwave frequency signal sources, the output signal power density at frequencies other than in a narrow band about the oscillator center frequency $f_o$ may be sufficiently high that maximum system performance is not attainable, particularly in PAM Doppler radar systems, i.e., pulse Doppler radar systems that employ rectangle pulse amplitude modulation of a low noise carrier frequency. Such limitation of performance is most serious in low duty factor pulse Doppler radar systems that employ either of the two previously described types of microwave signal sources for carrier frequency generation. The limitation is particularly serious at Fourier frequencies in the range of 500 Hz to 50,000 Hz as a result of the effective folding of noise at high Fourier frequencies into the range of 500 Hz to 50,000 Hz as a result of the PAM.

Circuits usually employed for VHF overtone mode crystal controlled oscillators have typically been based on the modified Pierce or the modified Butler (bridged tee circuit) as shown in FIG. 1. The crystal unit desirable in the design of a low noise VHF oscillator may be a fifth overtone AT cut crystal unit oscillating between 80 MHz to 100 MHz. The crystal unit electrostatic capacitance $C_o$ is formed by the two electrodes of the quartz crystal unit with quartz as the dielectric. A problem arises in the design of crystal units related to the untrapping of unwanted inharmonic modes of vibration. Typically, a high Q fifth overtone unit at 80 MHz will have an electrostatic capacitance in the order of 3.0 pF so that the dynamic or motional capacitance, which is the equivalent electrical capacitance of the mechanical resonator, will approximate 0.0005 pF. The crystal holder also introduces 0.2 to 0.5 pF in parallel with the dynamic capacitance. The intrinsic Q of quartz is $2.8 \times 10^6$ at 5.0 MHz. The parameter $Qf_o$ of $1.3 \times 10^{13}$ is essentially constant with frequency up to 100 MHz. Owing to the higher impedance of overtone modes, the crystal unit Q herein defined as $Q_x$ is higher for overtone modes, since the losses associated with the mounting leads and stray capacitance of the crystal holer are fixed and therefore a relatively smaller resistance to the electrically equivalent resonant resistance of the quartz crystal.

At 80 MHz, the crystal unit $Q_x$ approaches 70 percent of the intrinsic Q assuming a well designed crystal unit. Practical crystal units are found to exhibit a $Q_x$ of 90,000 to 130,000 at this frequency. Assuming a $Q_x$ of say 100,000, consider what is required to form an oscillator using the Pierce circuit. The impedance Z of the motional branch of the crystal unit electrical equivalent circuit as shown in FIG. 2 will exhibit an impedance, expressed by the following equation:

$$Z_1 = R_1 + j\frac{(f - f_s)}{\pi f_s^2 C_1} \quad (1)$$

where $f_s$ is the resonant frequency, $f$ is the frequency for which $Z_1$ is defined, $C_1$ is the motional capacitance and $R_1$ is the resistance of the motional branch. Since the circuit portion of FIG. 1*a* connected in parallel with the crystal unit will appear as an impedance $-R-j(X_1 + X_2)$ derived as shown in FIG. 1f shunted by the collector-to-base capacitance plus stray capacitance of the circuit, it is necessary that oscillation, if it could occur, be at a frequency $f$ such that the crystal unit is inductive in accordance with the above equation, and of a value that resonates the capacitance of the oscillator circuit. The problem is that because of the large value of $C_o/C_1$, the equivalent positive resistance exhibited by the crystal unit at its terminals rapidly increases as the frequency departs from the resonant frequency. Consider the following values:

$f_s$ = 80 MHz, 5th ovetone crystal unit

| Frequency ($f_o$) | Motional Z (ohms) | Crystal unit $Z_x$ (ohms) | Total (ohms) |
|---|---|---|---|
| $f_s$ + 1500 Hz | 39 + $j$ 149.20 | 66.9 + $j$ 190 | 143 + $j$ 258 |

Note: $R_1 = \frac{1}{2\pi f_s C_1 Q_x}$

The crystal unit $Z_x$ is the impedance at the crystal unit terminals, and the total is the impedance when the collector-to-base capacitance is absorbed as part of the crystal unit. Now the effective transconductance that is attainable at VHF from the oscillator circuit is in the order of (0.2) × Ie/26, where Ie is the dc current of the transistor element in the Pierce circuit in mA. There is a positive part of input resistance associated with the effects of base spreading resistance and transit time that can be viewed simply as further reduction in effective transconductance as well as a degrading factor of oscillating resonator $Q_l$. For the VHF oscillator the effective gm can then be considered to be about 0.1 Ie/26 or for low noise oscillators about 19,000 micromhos. The impedance of $X_1$ and $X_2$ that are required for −143 ohms input resistance is then $-j$ 86.7 ohms. This is a capacitance of 22.9 pF at 80 MHz. The typical transistor such as 2N2857 has ft approximately 1000 MHz and $f_{FE}$ approximately 50. The base-to-emitter capacitance at Ie of 5mA is then about 30.6 pF so it is seen that an oscillator cannot be realized readily. If one permits the transistor capacitance $C_{b'e}$ to establish $X_2$, then for −143 ohms, $X_1$ must be 114 ohms. Under such conditions of operation, however, $r_{bb}'$ the base spreading resistance needs to be included as part of the resonator impedance which leads to 220 ohms instead of 143 ohms assuming $r_{bb}' = 50$ ohms, $C_{cb}' = 2.0$ pF, strays 1.0 pF. The oscillating resonator $Q_l$ is then about 80/50 + 81 $Q_x$ = 0.618 $Q_x$ due only to base spreading resistance. This can be improved by lower $r_{bb}'$, but then transit time problems or excessive $C_{b'e}$ are encountered. The value of $X_1$ must be 175 ohms $X_1 + X_2$ is then 240 ohms. Oscillation then is possible at approximately 1500 Hz above the crystal unit resonant frequency.

There are several characteristics of the modified Pierce circuit that make it unsatisfactory for low FM noise at VHF.

1. The source impedance is relatively large since the circuit between base and emitter and base-collector is an anti-resonant circuit. The antiresonant resistance is approximately $$143 \left[1 + \left(\frac{258}{143}\right)^2\right] = 608 \text{ ohms.}$$

This is a source of thermal noise and further causes the current noise of the transistor to be more effective in perturbing signal current phase and hence reducing the short-term frequency stability. As a result, the ultimate value for $S_{\delta\phi}(f)$ the spectral density of the oscillator phase is much higher than that of a bridged tee circuit.

2. The oscillator resonator $Q_l$ is degraded by 30 to 40 percent from the crystal unit $Q_x$.

3. The most serious factor, however, is that in a well designed oscillator, the amplitude modulation of the signal current by low frequency noise results from the non-linear operation that is essential as the resulting phase fluctuation caused by the conversion of AM to PM in the transistor, but in this case of VHF Pierce oscillators, direct fluctuation of transistor reactance occurring from the amplitude fluctuation occurs, and since the transistor provides all of $X_2$ in the example noted, direct noise frequency modulation of the oscillating resonator occurs, and the result is that the FM noise is typically as much as 20 dB higher than exists in a well designed oscillator, as described in an article by the inventor of this invention, entitled "Flicker of Frequency and Phase and White Frequency and Phase Fluctuation in Frequency Sources", 26th Annual Frequency Control Symposium, June 1972.

At HF, the two tandem connected transistors as described in the above-noted article, reduce the direct FM as well as loading of the oscillating resonator. At VHF, however, this circuit does not yield the same improvement, and the FM noise of the Pierce circuit is higher than with the bridged tee, although the oscillating resonator $Q_l$ can be made about two or three times larger than the bridged tee which makes the frequency noise cutoff $f_c = f_o/2Q$, one-half that attained in the simple bridged tee circuit.

As indicated above, one indication of the noise content of a microwave signal is the power spectral density $L(f)$ of that signal. Assuming that harmonic currents can be neglected and that amplitude power spectral density is much smaller than the power spectral density due to phase fluctuations, the power spectral density of an oscillator circuit, for example that described in the above-noted article, may be expressed in terms of its phase noise power spectral density $L_G(f)$ as $$L_G(f) = \tfrac{1}{2} S_{\delta\phi}(f) \left[1 + \left(\frac{f_o}{2Qf}\right)^2\right] H(f) \quad (2)$$

The subscript G designates that $L(f)$ is the defined parameter for frequency generators and/or oscillators.

The single-sided power spectral density $S_{\delta\phi}(f)$ is related to $L_t(f)$ by the following relationship:

$$L_t(f) = \left(\frac{1}{2\ \text{rad}^2}\right) S_{\delta\phi}(f) \quad (3)$$

when phase fluctuations occurring at rates f and faster are small compared to one radian. Note that the designation $L_A(f)$ is used for the amplifier limiter of an oscillator whereas $L_t(f)$ is used for the entire oscillator. The above equations (2) and (3) are fundamental equations describing the short-term frequency stability of a harmonic oscillator. The first term of equation (2) is the frequency noise of the oscillator and the second term is the additive phase noise. It can be seen that for a Fourier frequency $f$ less than the quantity $f_o/2Q$, the oscillator output signal noise power spectrum as indicated by the term $L_t(f)$ is dominated by the frequency noise term. For Fourier frequencies f greater than the quantity $f_o/2Q$, the additive phase noise term dominates the oscillator output signal noise power spectrum. $H(f)$ depends on the circuit configuration and in some circuits its filtering of $L(f)$ due to additive phase prevents observation of transition from frequency noise to additive phase noise.

In the above-identified, co-pending application entitled, "Low Noise VHF Crystal Controlled Harmonic Oscillator", a VHF crystal controlled harmonic oscillator is disclosed as comprising a pair of cascode connected transistors, an antiresonant circuit including a quartz crystal unit connected to the input of one of the pair of transistors, and a current limiting circuit for preventing the pair of transistors from being driven to saturation. As described in the noted application, such a controlled harmonic oscillator provides a large ratio of output to crystal unit power dissipation without significant degradation of oscillating resonator $Q_l$ from the crystal unit $Q_x$. However, at high Fourier frequencies, the $L(f)$ of this microwave frequency source was limited by the noise from the frequency multiplier circuit which the oscillator drives rather than from the oscillator noise. Previous designs afforded a power output of only +10 dBm while maintaining a crystal unit drive of 500 microwatts. In particular, a cascode VHF amplifier design of exceptionally low noise typically can produce only a +10 dBm power output. If it is desired to increase the negative feedback in the frequency multiplier which follows the oscillator, in order to reduce noise modulation in the multiplier, the source impedance related to the oscillator must be increased in order to obtain necessary voltage for the frequency multiplier with increased negative feedback. The result is an increase in thermal noise associated with the source resistance which in turn increases the white $L(f)$ noise of the frequency source.

SUMMARY OF THE INVENTION

It is therefore an object of this invention to provide a new and improved signal source by permitting higher stable gain with the subsequent benefit of higher power with low FM noise.

It is a further object of this invention to provide a relatively high level signal source permitting the use of a larger amount of negative feedback in the frequency multiplier stage following the oscillator, which in turn suppresses $1/f$ flicker of phase without compromising white phase noise.

In accordance with these and other objects, there is provided a microwave frequency source comprising first and second transistors, and a first resonant circuit, resonant within a predetermined frequency range and coupled to each of the collectors of the first and second transistors. Basically, a form of grid neutralization is applied to the first and second transistors, whereby the base-to-emitter swings are very small compared with the collector-to-base voltages. In particular, coupling means such as a transformer coupled with the inductance of the first resonant circuit for applying signals of substantially equal amplitude but opposite phase to the bases of the first and second transistors.

In another aspect of this invention, an antiresonant circuit is coupled to the emitter of the first transistor and includes a crystal unit, whereby the frequency of the entire microwave frequency source of circuit is precisely controlled.

In a further aspect of this invention, a bypass capacitor is connected to the emitter of the charactristically non-conducting transistor. Further, a diode limiting circuit may be employed whereby the voltage applied to the first and second transistors is limited to prevent saturation thereof.

BRIEF DESCRIPTION OF THE DRAWINGS characteristically

These and other objects and advantages of the present invention will become more apparent by referring to the following detailed description and accompanying drawings, in which:

FIGS. 1*a* to 1*f* show schematically control circuits for a crystal oscillator in accordance with the prior art;

DESCRIPTION OF THE PREFERRED EMBODIMENT

Generally, the oscillator circuit of this invention permits higher stable gain than is attainable with previous designs employing cascode amplifiers, and as a result, higher output power with low FM noise is available. With more available power, the frequency multiplier stage following the oscillator can employ a larger amount of negative feedback which then suppresses further its $1/f$ flicker of phase without requiring an increase in source resistance. More power output from the oscillator is realized by providing a higher ratio of available power to crystal unit power without increasing the frequency noise cutoff frequency fc in the oscillator.

Stable gain in oscillators under large signal conditions is possible using the equivalent of grid neutralization applied to the transistor elemerfts of the oscillator. The principle involved is that the base-to-emitter voltage swings, which are characteristically very small in amplitude and not in-phase, will be a small portion of the collector-to-base voltage which in practice can approach 20 volts peak. Since the transistors exhibit a time varying output capacitance depending on the collector-to-base voltage, the two transistors comprising the amplifier portion of the oscillator will be better matched using the equivalent of grid neutralization.

The oscillator circuitry employs a resonant circuit of conductance and capacitance, two transistor amplifiers, a quartz crystal unit, a resistive element for biasing and current control, bypass capacitors and a current, limiting circuit employing hot carrier diodes. The transistors are matched for $C_{cb}'$ versus $V_{cb}$ characteristics using a three terminal bridge so that $C_{ce}$ and $C_{b'e}$ are effectively removed from consideration in circuit operation. Note the following definitions:

| | | |
|---|---|---|
| $C_{cb}'$ | = | depletion layer capacitance of the base-collector junction. |
| $V_{cb}$ | = | collector-to-base voltage. |
| $C_{ce}$ | = | collector-to-emitter capacitance. |
| $C_{b'e}$ | = | base-emitter junction capacitance. |

The transistors should also be tested for avalanche currents and only those transistors exhibiting no avalanche current for 40–50 volts $V_{cb}$ should be used.

Originally in the oscillator circuit design, it was intended to operate one transistor element with an open emitter, using the non-conducting transistor as a voltage dependent capacitance in the neutralizing circuit. When such a circuit was evaluated, it was found that the reverse transmisson was attenuated by only 40 dB. By bypassing the base of the previously non-conducting transistor with a capacitor, the reverse transmission is measured to be attenuated by 80 dB at 30 MHz. The bypassing capacitor eliminates the mismatch in the feedback path of the conducting transistor and non-conducting transistor caused by $C_{ce}$ in series with $C_{b'e}$, paralleling the required $C_{cb}'$.

Figure 1A:
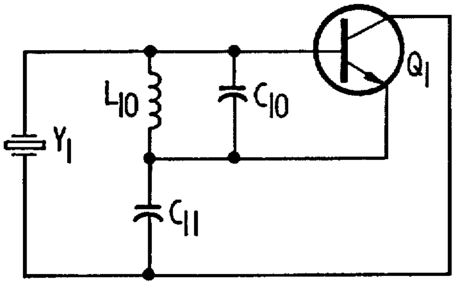
FIG. 1(a) PRIOR ART
Figure 1B:
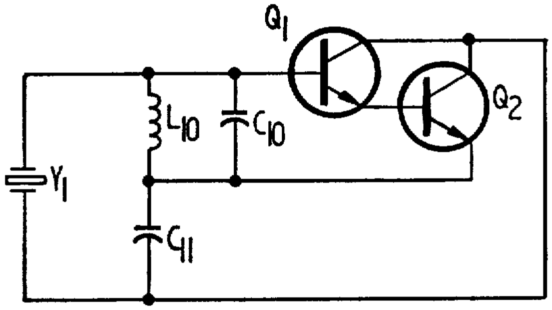
FIG. 1(b) PRIOR ART
Figure 1C:
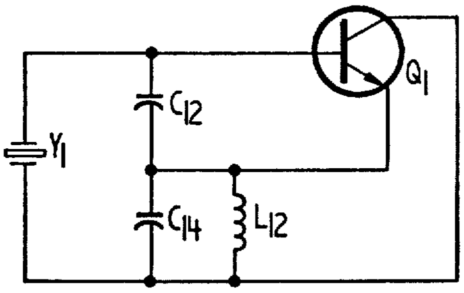
FIG. 1(c) PRIOR ART
Figure 1D:
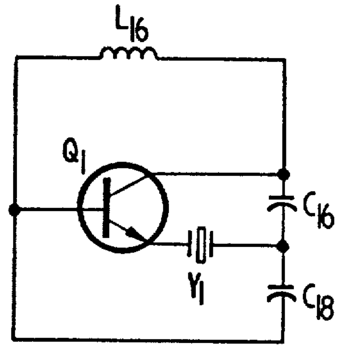
FIG. 1(d) PRIOR ART
Figure 1E:
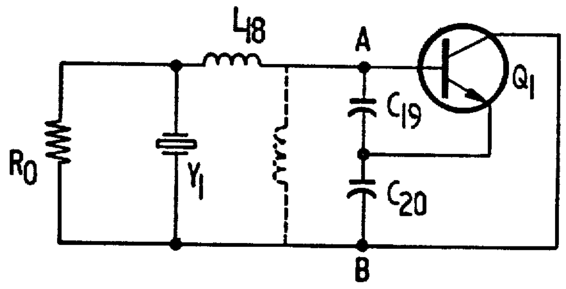
FIG. 1(e) PRIOR ART
Figure 1F:
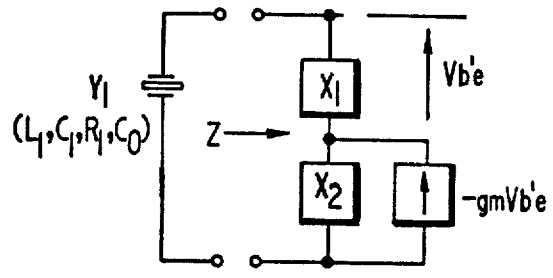
Figure 3:
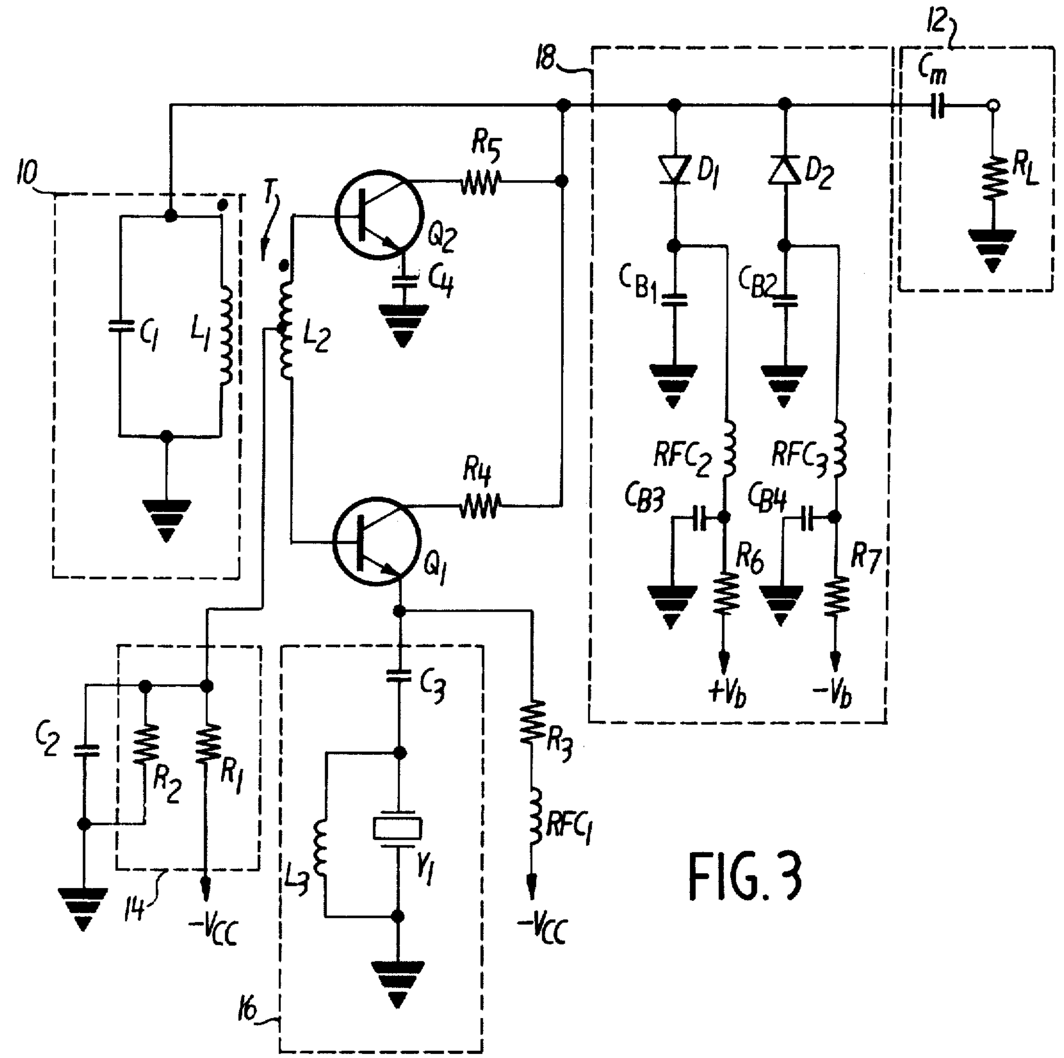
FIGS. 3 and 4 illustrate, respectively, a detailed and a simplified circuit diagram of the novel features of the invention.
Figure 2:
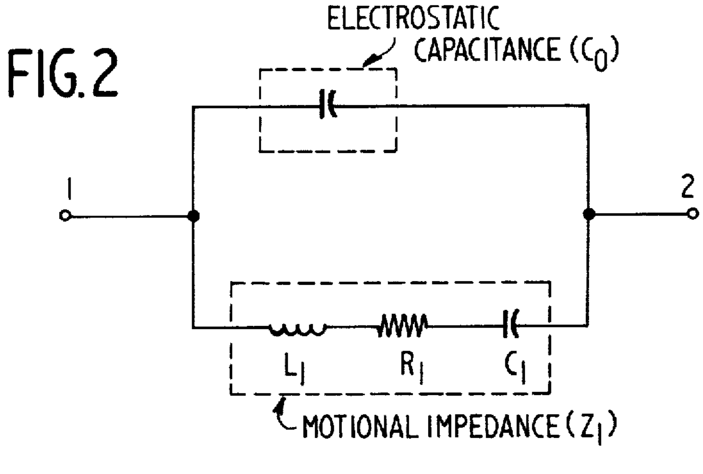
FIG. 2 is an equivalent circuit of a quartz crystal unit.
Figure 4:
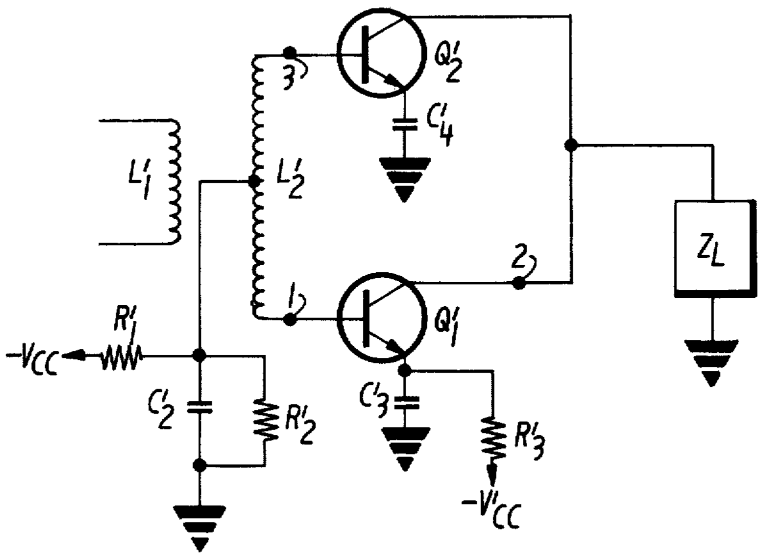
Figure 5:
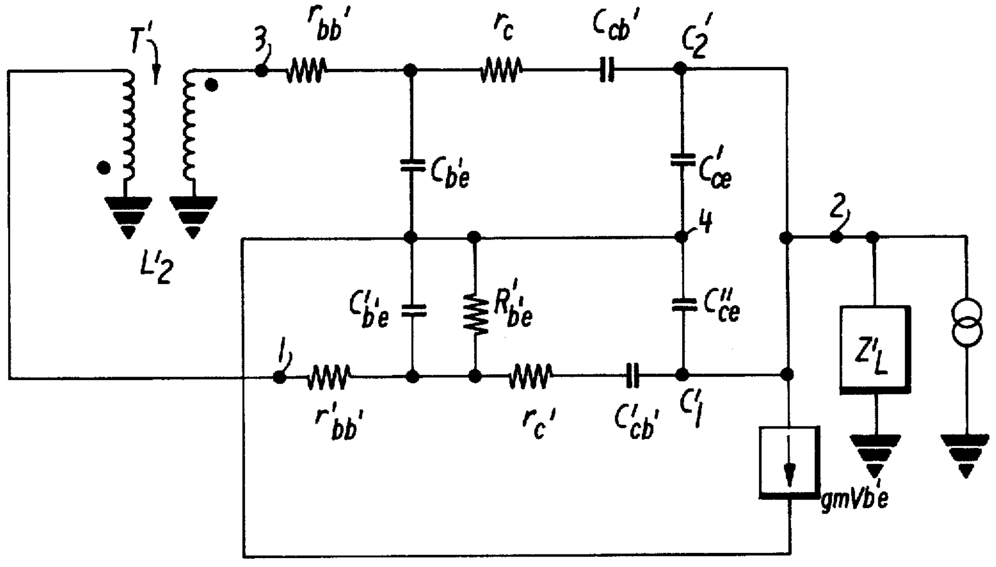
FIG. 5 is the equivalent circuit for the simplified circuit diagram of FIG. 4.

With reference to FIG. 3, the low noise VHF oscillator of this invention is described first as to its circuit element and secondly with respect to its equivalent circuit as shown in FIGS. 4 and 5. In FIG. 3, a parallel resonant circuit 10 comprised of capacitor $C_1$ and inductor $L_1$ is connected to the collector of transistor Q1 through resistor R4 in series and to the collector of transistor Q2 through resistor R5 is series. Also connected to the resonant circuit 10 is a load circuit 12 comprising capacitance $C_m$ and resistor $R_L$. The values of $C_m$, $R_L$, $C_1$ and $L_1$ are selected to be antiresonant at approximately the desired output frequency of the oscillator circuit. In an illustrative embodiment of this invention, capacitor $C_1$ is selected to be 5 to 10 pF for oscillation between 50 MHz to 100 MHz.

Energy is coupled from the resonant circuit 10 to a secondary winding $L_2$ for purposes of feedback. The windings $L_1$ and $L_2$ are tightly coupled in construction and $L_2$ is a bi-filar winding. In an illustrative embodiment, the turn ratio of $L_1$ to $L_2$ in terms of number of turns of winds in typically 40:1. Winding $L_2$ is center-tapped to apply equal voltages opposite in phase by 180° to the bases of transistors Q1 and Q2. Proper voltage biasing to Q1 and Q2 is provided by a resistor divider network 14 comprised of resistors R1 and R2 connected in series from the circuit supply voltage of $-V_{cc}$ to circuit ground potential. In addition, capacitor $C_2$ is employed to bypass RF frequencies to circuit ground. Illustratively, the voltage at the transistor bases is in the order of −25 volts.

The emitter of transistor Q2 is bypassed to ground by capacitor C4. The emitter of transistor Q1 is connected to the circuit current supply through resistor R3, RF choke coil $RFC_1$ to supply voltage $-V_{cc}$. Further, the emitter of transistor Q1 is coupled to an antiresonant circuit 16 comprising a quartz crystal Y1 antiresonated with inductor L3 which is series connected to capacitor C3. Crystal units best suited for this oscillator application are AT-cut thickness shear resonators operated with power dissipation on the order of 250 to 500 microwatts. For crystal resistance values between 30 and 50 ohms, the corresponding frequency range, from energy trapping considerations, is 50 to 100 MHz. At 50 MHz, the intrinsic Q of an AT-cut fifth overtone crystal unit is typically 250,000 and at 150 MHz is 83,000. At 75 MHz the realizable Q will approach 0.7 to 0.8 of the intrinsic Q.

The phase shift in the oscillator circuit is not dominantly controlled by the antiresonant circuit 16, but by the quartz crystal unit Y1 with total capacitance from emitter to ground of Q1 anti-resonated at the crystal unit resonant frequency. The dominant loading on the crystal unit Y1 is the resistance and inductance exhibited by emitter to ground of Q1 as expressed by:

$$Z = \frac{26}{Ie} + \frac{Z_s + r_{bb}' + jX_{bb}'}{1 + h_{fe}} \quad (4)$$

where

| | | |
|---|---|---|
| $h_{fe}$ | = | the complex common emitter current gain of transistor Q1 at the oscillation frequency. |
| Ie | = | the dc emitter current in Q1 in milliamperes. |
| $Z_s$ | = | the effective source impedance appearing between the base of transistor Q1 and ground. |
| $r_{bb}'$ | = | the base spreading resistance of transistor Q1. |
| $X_{bb}'$ | = | the reactance in the base lead of transistor Q1. |

The term $h_{fe}$ is complex with a typical magnitude of about 8 to 10 lagging in angle of 80°, for VHF/UHF transistors used in the function of Q1 and Q2. Capacitor C3 is selected to series resonate, at the frequency of the crystal unit Y1 with the inductive part of Z. Because of the very small uncontrolled positive feedback provided by the bridge arrangement of Q1 and Q2, in comparison with a single transistor, it is possible to operate the amplifier with much higher power gain. For a fixed power dissipation in the quartz crystal unit, much larger output power is then attainable with high effective oscillator Q than in the prior art.

A limiting circuit 18 is employed comprising hot carrier diodes D1 and D2 to provide the limiting function that is required of the harmonic oscillator. The diodes D1 and D2 conduct when the potential across them exceeds 0.4 volts. In an illustrative embodiment, selecting voltage +Vb to be 19.6 volts and voltage −Vb to be −19.6 volts, limiting is controlled for the oscillator circuit between +20 and −20 volts. RF choke coils $RFC_2$ and $RFC_3$ and capacitors, $CB_1$, $CB_2$, $CB_3$ and $CB_4$ provide RF decoupling. Resistors R6 and R7 are illustratively 51 ohms and provide current surge protection to the power supplies for +Vb and −Vb.

The invention is more fully understood with reference to FIGS. 4 and 5. FIG. 3 shows the two transistor elements Q'1 and Q'2 with emitters bypassed to ground provided by capacitors C3 and C4, respectively. Current is supplied to the circuit through resistor R'3 from voltage source $-V'_{cc}$. $L_1'$ is the primary inductance of a two-winding transformer having $L_2'$ as the self inductance of the secondary winding which is precisely center tapped. Biasing is provided by resistors R'1 and R'2, and capacitor C'2 provides signal ground at the center tap of inductance $L_2'$. Q1' is the active amplifying transistor. When impedance $Z_L$ is made an antiresonant circuit in order to achieve a large magnitude for impedance $Z_L$ at VHF which in turn yields a large signal voltage amplification from the base of transistor Q1′ to collector of Q2′ that is required to achieve the necessary high signal-to-noise ratio when the amplifier is utilized in the disclosed oscillator circuit, it is not possible to achieve stable controlled amplification owing to the feedback that occurs between collector and base of transistor Q1′ due to the collector-to-base depletion layer capacitance.

However, the effect of this feedback is nullified in the circuit of FIG. 4 becasue of the connection of Q2′ together with capacitor C4′, as shown. The feedback occurring in Q1′ due to the collector-to-base depletion layer capacitance between terminals 2 and 1 also occurs between terminals 2 and 3 through transistor Q2′. When capacitor C4′ is a large capacitance that will effectively place the emitter of Q2′ at signal ground potential and when Q1′ and Q2′ are matched for their depletion layer capacitance variation of the collector-to-base junction, then with a balanced transformer winding as can be provided by a well-constructed bifilar winding cross-connected, the feedback from terminals 2 to 1 is cancelled effectively by the feedback provided from terminals 2 to 3 owing to the 180° phase reversal provided between terminals 3 to ground and 1 to ground.

With this effective cancellation of the undesired feedback, it becomes practical to achieve stable signal amplification in the single transistor Q1′ in excess of that normally achieved using a single transistor amplifying stage at VHF.

In FIG. 5, an approximate equivalent circuit is shown to explain the operation of the circuit of FIGS. 3 and 4. The potential between terminals 2 and 4 is applied to capacitances $C_{cb}'$ and $C'_{cb}'$. It is not necessary that $C'_{ce}$ be identical to $C''_{ce}$. The potentials at terminals 3 and 1 are identical but out of phase when $V_c$, $C_{cb}'$ and $V_c'$, $C'_{cb}'$, which represent parameters of Q1′ and Q2′, respectively, are well-matched. The magnitude of $C'_{be}$ is much less than $C'_{b'e}$, and also $R'_{b'e}$ shunts $C'_{b'e}$ owing to the fact that Q2′ is nonconducting, whereas Q1′ is conducting. However, when the coupling coefficient "k" of T′ is nearly unity and the windings are identical, the voltage unbalance is insignificant and as a result, the potential appearing at terminals 3 to ground and 1 to ground due to the potential appearing from terminal 2 to ground is typically less than 1/2000 the potential of terminal 2 to ground.

The power output increase that is realized by the invention is approximately 8 times that of previous designs. This improvement relates to a 2.8 times greater excitation voltage for the same source impedance driving the frequency multiplier. By using the hot carrier diode as a limiter, the increase in voltage excitation is accommodated without exceeding $V_{cb}$ of frequency multiplier transistors; hence larger negative feedback for the same harmonic output power can be used in a frequency multiplier circuit following the oscillator of the invention, and the $L(f)$ of the resulting microwave signal in the Fourier frequency range of 1000 to 10,000 Hz can be reduced. Alternatively, the source resistance of the frequency multiplier driven by the oscillator can be reduced without increasing the negative feedback. In this case, a much lower $L(f)$ will be obtained for the microwave signal at Fourier frequencies greater than 10,000 Hz while maintaining the same performance between frequencies of 1000 Hz to 10,000 Hz.

Numerous changes may be made in the above-described apparatus and the different embodiments of the invention may be made without departing from the spirit thereof; therefore, it is intended that all matter contained in the foregoing description and in the accompanying drawings shall be interpreted as illustrative and not in a limiting sense.

What is claimed is:

1. An oscillator circuit for generating a low noise, high frequency output signal, said oscillator circuit comprising:

a. a first amplifier transistor and a second compensation transistor, each having base, collector and emitter terminals, said first and second transistors having matched collector-to-base properties;

b. first resonant circuit resonating at a frequency within a prescribed frequency range, said first resonant circuit coupled to said collector electrodes of each of said first and second transistors;

c. means for coupling energy from said first resonant circuit to said first and second transistors so that sustained, free oscillation is established in said first resonant circuit, said coupling means applying signals of substantially equal amplitude but opposite phase to said base electrodes of said first and second transistors; and d. isolation means coupled to said emitter terminal of said second transistor for providing a low A.C. impedance path to circuit ground and for providing an open circuit to D.C. currents, whereby only the dynamic collector-to-base capacitance of said second transistor is effectively connected in a feedback circuit established through said coupling means to said first transistor.

2. The oscillator circuit as claimed in claim 1, wherein said first resonant circuit comprises an inductive element and a capacitive element, and said coupling means comprises a transformer whose input coil comprises said inductive element of said first resonant circuit and an output coil coupled to said base terminals of said first and second transistors.

3. The oscillator circuit as claimed in claim 1, wherein there is included a resistive network for establishing the proper biasing potential signals to be applied to the base terminals to said first and second transistors.

4. An oscillator circuit for generating a low noise, high frequency output signal, said oscillator compising:

a. amplifier transistor means having a first input terminal for determining its output derived from second and third terminals thereof, said amplifier means presenting a variable capacitance characteristic between its first and second terminals;

b. compensation transistor means having a variable capacitance characteristic between its first and second terminals substantially identical to that of said amplifier means, and a third terminal;

c. first resonant circuit resonating at a frequency within a prescribed frequency range, said first resonant circuit coupled to said second terminals of said amplifier means and said compensation means;

d. isolation means coupled to said third terminal of said compensation transistor means for providing a low A.C. impedance path to circuit ground and for providing an open circuit to D.C. currents; and e. means for coupling energy from said first resonant circuit to said amplifier means so that sustained, free oscillation is established in said first resonant circuit, said coupling means applying signals of substantially equal amplitude but opposite phase to said first terminals of said amplifier means and said compensation means, whereby the dynamic variable capacitance of said compensation means is coupled effectively in a feedback circuit established through said coupling means to said amplifier means.

5. An oscillating circuit as claimed in claim 4, wherein said isolation means comprises a capacitor which is further coupled to circuit ground.

6. An oscillator circuit for generating a low noise, high frequency output signal, said oscillator circuit comprising:

a. a first amplifier transistor and a second compensating transistor, each having base, collector and emitter terminals, said first and second transistors having matched collector-to-base properties;

b. first resonant circuit resonating at a frequency within a prescribed frequency range, said first resonant circuit coupled to said collector electrodes of each of said first and second transistors;

c. means for coupling energy from said first resonant circuit to said first and second transistors so that sustained free oscillation is established in said first resonant circuit, said coupling means applying signals of substantially equal amplitude but opposite phase to said base electrodes of said first and second transistors; and d. isolation means coupled to said emitter terminal of said second transistor for providing a low A.C. impedance path to circuit ground and for providing an open circuit ot D.C. currents, whereby only the dynamic collector-to-base capacitance of said second transistor is effectively connected in a feedback circuit established through said coupling means to said first transistor, said isolation means comprising a capacitor which is further coupled to circuit ground.

7. An oscillator circuit for generating a low noise, high frequency output signal, said oscillator circuit comprising:

a. a first amplifier transistor and a second compensating transistor, each having base, collector and emitter terminals, said first and second transistors having matched collector-to-base properties;

b. first resonant circuit resonating at a frequency within a prescribed frequency range, said first resonant circuit coupled to said collector electrodes of each of said first and second transistors;

c. second resonant circuit coupled to said emitter terminal of said first transistor, including a reference frequency element, whereby the frequency of the resonating signal established through said first transistor is slaved to that of said reference frequency element;

d. means for coupling energy from said first resonant circuit to said first and second transistors so that sustained free oscillation is established in said first resonant circuit, said coupling means applying signals of substantially equal amplitude but opposite phase to said base electrodes of said first and second transistors; and e. isolation means coupled to said emitter terminal of said second transistor for providing a low A.C. impedance path to circuit ground and for providing an open circuit to D.C. currents, whereby only the dynamic collector-to-base capacitance of said second transistor is effectively connected in a feedback circuit established through said coupling means to said first transistor.

8. The oscillator circuit as claimed in claim 7, wherein said reference frequency element comprises a crystal unit.

9. The oscillator circuit as claimed in claim 7, wherein the reference frequency element comprises an AT-cut overtone crystal unit.

10. An oscillator circuit for generating a low noise, high frequency output signal, said oscillator circuit comprising:

a. a first amplifier transistor and a second compensating transistor, each having base, collector and emitter terminals, said first and second transistors having matched collector-to-base properties;

b. a limiting circuit coupled to each of said collector terminals of said first and second transistors, for establishing a range of voltages in which said first and second transistors may be driven without reaching the saturation limits of said first and second transistors;

c. first resonant circuit resonating at a frequency within a prescribed frequency range, said first resonant circuit coupled to said collector electrodes of each of said first and second transistors;

d. means for coupling energy from said first resonant circuit to said first and second transistors so that sustained free oscillation is established in said first resonant circuit, said coupling means applying signals of substantially equal amplitude but opposite phase to said base electrodes of said first and second transistors; and e. isolation means coupled to said emitter terminal of said second transistor for providing a low A.C. impedance path to circuit ground and for providing an open circuit to D.C. currents, whereby only the dynamic collector-to-base capacitance of said second transistor is effectively connected in a feedback circuit established through said coupling means to said first transistor.

11. The oscillator circuit as claimed in claim 10, wherein said limiting circuit includes first and second unidirectional conducting means coupled respectively to low noise power sources of first and second levels, corresponding to the limits of said range.

12. An oscillator circuit for generating a low noise, high frequency output signal, said oscillation circuit comprising:

a. a first amplifier transistor and a second compensating transistor, each having base, collector and emitter terminals, said first and second transistors having matched collector-to-base properties;

b. first resonant circuit resonating at a frequency within a prescribed frequency range, said resonant circuit coupled to said collector electrodes of each of said first and second transistors, said first resonant circuit comprising an inductive element and a capacitive element;

c. means for coupling energy from said first resonant circuit to said first and second transistors so that sustained, free oscillation is established in said first resonant circuit, said coupling means applying signals of substantially equal amplitude but opposite phase to said base electrodes of said first and second transistors, said coupling means comprising a transformer whose input coil comprises said inductive element of said first resonant circuit and an output coil coupled to said base terminals of said first and second transistors;

d. isolation means coupled to said emitter terminal of said second transistor for providing a low A.C. impedance path to circuit ground and for providing an open circuit to D.C. currents, whereby only the dynamic collector-to-base capacitance of said second transistor is effectively connected to a feedback circuit established through said coupling means to said first transistor; and e. a network coupled to a tap of said transformer and comprising a capacitor disposed between said tap and circuit ground, and a resistor bridge coupled to said tap for applying a biasing signal thereto.

* * * * *